(12) United States Patent
Thompson et al.

(10) Patent No.: US 10,367,516 B2
(45) Date of Patent: Jul. 30, 2019

(54) JITTER REDUCTION TECHNIQUES WHEN USING DIGITAL PLLS WITH ADCS AND DACS

(71) Applicant: Analog Devices Global, Hamilton (BM)

(72) Inventors: Frederick Carnegie Thompson, Foynes (IE); Varun Agrawal, Ghaziabad (IN); Jose Barreiro Silva, Bedford, MA (US); Declan M. Dalton, Ballyneety (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/674,985

(22) Filed: Aug. 11, 2017

(65) Prior Publication Data

US 2019/0052281 A1    Feb. 14, 2019

(51) Int. Cl.
*H03L 7/16*    (2006.01)
*H03M 1/08*    (2006.01)
*H03K 5/1252*    (2006.01)
*H03K 7/06*    (2006.01)
*H03L 7/089*    (2006.01)
*H03M 1/06*    (2006.01)
(Continued)

(52) U.S. Cl.
CPC ........ *H03M 1/0836* (2013.01); *H03K 5/1252* (2013.01); *H03K 7/06* (2013.01); *H03L 7/0893* (2013.01); *H03M 1/0621* (2013.01); *H03M 1/1245* (2013.01); *H04L 27/066* (2013.01); *H03M 1/747* (2013.01); *H03M 3/43* (2013.01); *H03M 3/458* (2013.01)

(58) Field of Classification Search
CPC .. H03M 1/124; H03M 1/1245; H03M 1/0617; H03M 1/08; H03M 1/0836; H03M 1/0845; H03L 7/091; H03L 7/16; H03L 2207/50
See application file for complete search history.

(56) References Cited

U.S. PATENT DOCUMENTS

7,688,242 B2 *  3/2010  Shimizu ................ G04F 10/005
                                                    341/122
8,022,849 B2 *  9/2011  Zhang .................... H03L 7/085
                                                    341/142
(Continued)

*Primary Examiner* — An T Luu
(74) *Attorney, Agent, or Firm* — Schwegman Lundberg & Woessner, P.A.

(57) ABSTRACT

This disclosure relates to data converters for electronic systems. An example system includes a primary analog to digital converter (ADC) circuit, a slope calculation circuit, a digital phase lock loop (DPLL) circuit, a sampling error circuit, and a summing circuit. The primary ADC circuit samples an input signal and produces a digital output signal representative of the input signal. The slope calculation circuit generates a digital slope signal representative of slope of the input signal, and the DPLL circuit provides a sampling clock signal to the primary ADC circuit. The sampling error circuit generates a sampling error signal representative of sampling error by the primary ADC circuit using the digital slope signal and the sampling clock signal. The summing circuit receives the sampling error signal and the digital output signal of the primary ADC circuit and generates an adjusted digital output signal representative of the input signal.

24 Claims, 5 Drawing Sheets

(51) Int. Cl.
  *H03M 1/12* (2006.01)
  *H04L 27/06* (2006.01)
  *H03M 1/74* (2006.01)
  *H03M 3/00* (2006.01)

(56) References Cited

U.S. PATENT DOCUMENTS 8,203,472 B2 * 6/2012 Robinson ............ H03M 1/0836
 341/118
8,957,796 B2 * 2/2015 Waltari ................ H03L 7/091
 341/118

* cited by examiner

JITTER REDUCTION TECHNIQUES WHEN USING DIGITAL PLLS WITH ADCS AND DACS

FIELD OF THE DISCLOSURE

This document relates to electronic circuits for data conversion. Some embodiments relate to circuits that improve signal-to-noise performance of data converters.

BACKGROUND

Electronic systems can include data converters such as analog-to-digital (A/D) converters (ADCs) and digital-to-analog (D/A) converters (DACs). Some ADCs and DACs are used with phased locked loop (PLL) circuits that provide timing signals for operation of the data converters. Performance of data converters can be adversely affected by non-idealities in PLL circuits. For example, the signal-to-noise ratio of data converters can be adversely affected by clock jitter of the PLL circuits. The present inventors have recognized a need for improved performance of data converters.

SUMMARY OF THE DISCLOSURE

This document relates generally to data converter circuits, and in particular to reducing errors in the data converter circuits. In some embodiments, an electronic device includes a primary analog to digital converter (ADC) circuit, a slope calculation circuit, a digital phase lock loop (DPLL) circuit, a sampling error circuit, and a summing circuit. The primary ADC circuit samples an input signal and produces a digital output signal representative of the input signal. The slope calculation circuit generates a digital slope signal representative of slope of the input signal, and the DPLL circuit provides a sampling clock signal to the primary ADC circuit. The sampling error circuit generates a sampling error signal representative of sampling error by the primary ADC circuit using the digital slope signal and the sampling clock signal. The summing circuit receives the sampling error signal and the digital output signal of the primary ADC circuit and generates an adjusted digital output signal representative of the input signal.

In some embodiments, an electronic device includes a slope calculation circuit configured to calculate slope of an input signal; a digital-to-analog converter (DAC) circuit configured to sample a DAC input signal and produce an analog output signal from the sampled DAC input signal; a digital phase lock loop (DPLL) circuit configured to provide a sampling clock signal to the DAC circuit; a sampling error circuit configured to generate a sampling error signal representative of sampling error by the DAC circuit using the slope of the input signal and the sampling clock signal; and a summing circuit configured to receive the sampling error signal and the input signal, and provide an adjusted input signal as the DAC input signal sampled by the DAC circuit.

In some embodiments, an electronic device includes a delta sigma analog-to-digital converter (ADC) circuit including: a forward circuit path including a latched comparator circuit; and a feedback path operatively coupled to an output of the latched comparator circuit and including a digital-to-analog converter (DAC) circuit, wherein the DAC circuit is a current DAC circuit; a digital phase lock loop (DPLL) circuit configured to provide a sampling clock signal to the DAC circuit; a timing error calculation circuit operatively coupled to the DPLL circuit and configured to determine a timing error in the DPLL circuit and generate a correction factor using the timing error; and an output circuit operatively coupled to the delta sigma ADC circuit and the timing error calculation circuit and configured to modify the output of the delta sigma ADC circuit using the correction factor.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Electronic systems can include one or both of ADCs and DACs. An ADC first samples an incoming analog signal to convert the analog signal to a digital signal. The timing of the sampling can be determined by a clock signal. A DAC uses a clock signal to sample or advance the digital value of a digital stream that is converted to an analog signal. PLL circuits can be used to generate the clock signal for data conversion. A PLL may be desired in a data converter when clock data recovery is needed in the data converter. However, non-idealities of PLL circuits can have an adverse effect on data converter performance. For example, the signal-to-noise ratio of data converters degrades due to jitter on the clock signal generated by the PLL. For some types of PLLs, information is available that allows the non-idealities such as clock jitter to be anticipated. This information can be used to mitigate the adverse effects and minimize errors in data conversion.

Figure 1A:
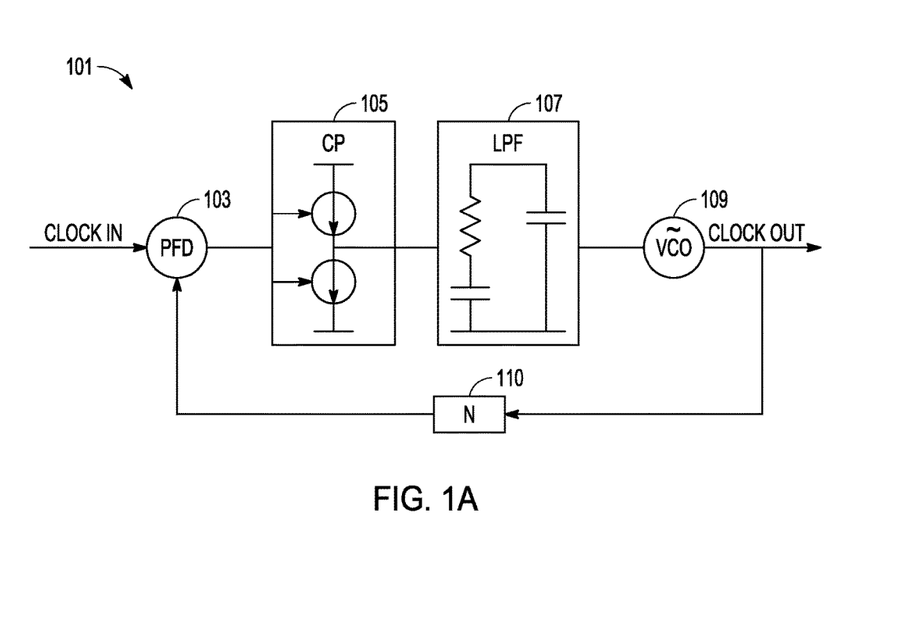
FIG. 1A is a block diagram of an embodiment of an analog phase locked loop (PLL) circuit.

FIG. 1A is a block diagram of an embodiment of an analog phase locked loop (PLL) circuit 101. A PLL can include a phase frequency detector (PFD), a charge pump (CP), a low pass filter (LPF), a voltage controller oscillator (VCO), and a feedback divider circuit 110 in a feedback path. The feedback divider divides down the output clock by a ratio of 1/N which is fed back to the PFD. Ideally, negative feedback in the PLL reduces error between the reference signal and the output signal, and the output signal is in phase and frequency lock with the input reference signal.

Figure 1B:
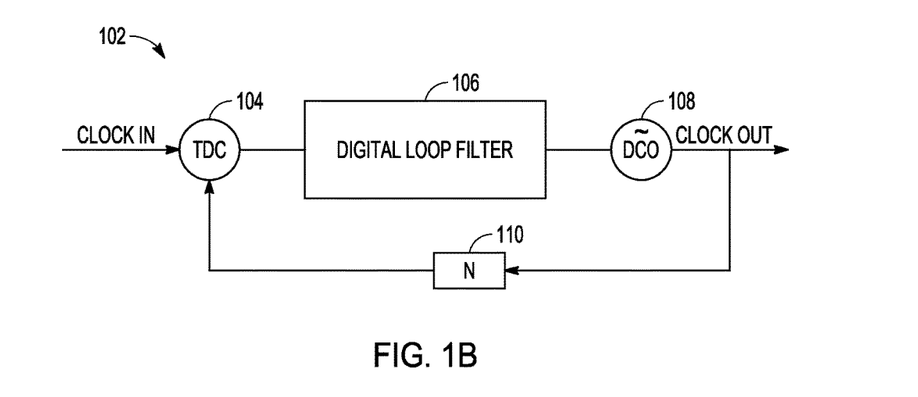
FIG. 1B is a block diagram of an embodiment of a digital phase locked loop (DPLL) circuit.

FIG. 1B is a block diagram of an embodiment of a digital phase locked loop (DPLL) circuit 102. The embodiment shown in FIG. 1 is one type of several different architectures available for DPLL circuits. In the DPLL circuit 102, a time to digital converter (TDC) circuit 104 functions as the PFD, a digital loop filter 106 replaces the CP and LFP, and a digital controlled oscillator (DCO) circuit 108 functions as the VCO. The TDC circuit 104 receives an incoming reference clock (Clock IN) and measures the difference in time between the incoming reference clock and the output clock signal divided down and fed back by the feedback divider circuit 110. An example of a TDC circuit 104 is a gated ring oscillator (GRO). Any non-linearity in the output of the TDC circuit 104 is filtered by the digital loop filter circuit 106. The digital loop filter circuit 106 provides Nth order filtering (e.g., first order or second order filtering) to the output of the TDC circuit 104. The output of the digital loop filter circuit 106 drives the DCO circuit 108. Changing the DCO code results in a corresponding change in output frequency of the output clock.

In the DPLL circuit 102, information present at the output of the digital loop filter circuit 106 can indicate when the frequency of the output clock signal is going to increase or decrease. The gain factor $K_{DCO}$ of the DCO circuit 108 indicates the gain in frequency versus input code. The center frequency $f_0$ of the DCO circuit 108 is the oscillation frequency when the input code to the DCO is zero (the center frequency corresponds to the free running frequency of an analog PLL). By knowing the gain factor and the center frequency, it is possible to tell if the output of the DCO circuit 108 will speed up or slow down and to estimate how much the change in frequency will be. This information may be useful to suppress non-idealities in DPLLs such as signal jitter that affect data conversion.

Figure 2:
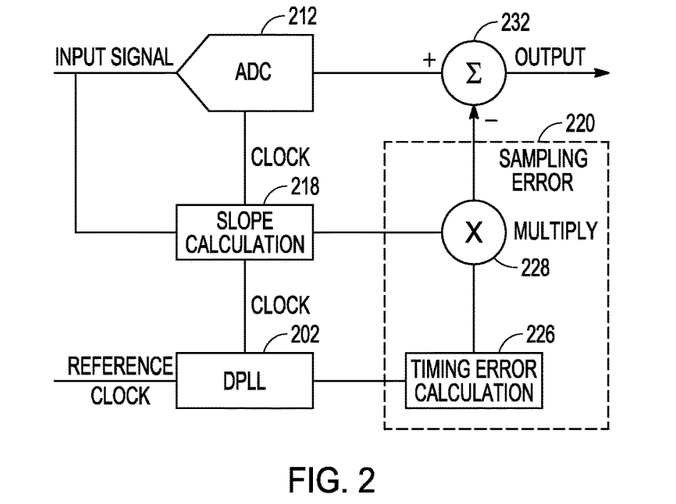
FIG. 2 is a block diagram of an example of a data converter that includes an analog-to-digital converter (ADC) circuit and a DPLL circuit.

FIG. 2 is a block diagram of an example of a data converter 200 that includes an ADC circuit 212 and a DPLL circuit 202. The ADC circuit 212 samples an analog input signal to convert the analog signal to a digital signal. The DPLL circuit 202 receives a reference clock signal and produces the sampling clock signal used by the ADC circuit 212. Jitter in the sampling clock signal can lead to errors in the A/D conversion.

Figure 3:
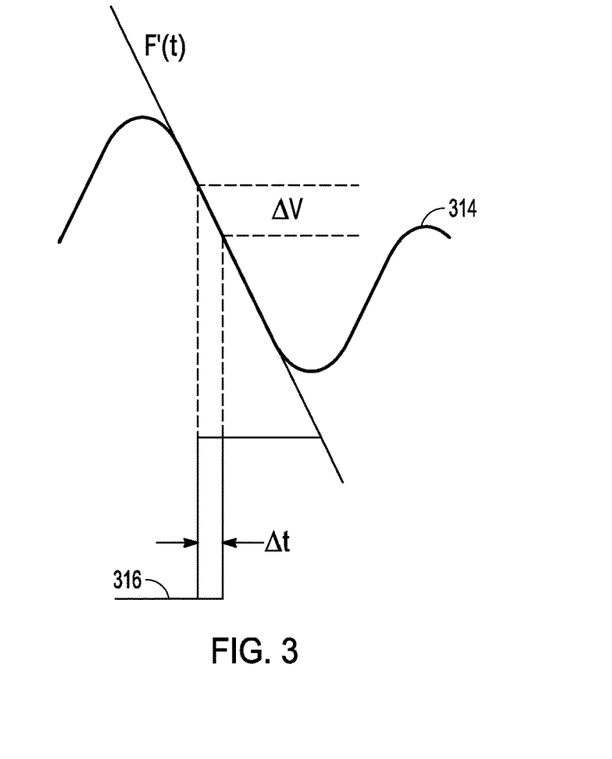
FIG. 3 is an illustration of an example of analog signal and a sampling clock signal.

FIG. 3 is an illustration of an example of an analog signal 314 and a clock signal 316. The analog signal is F(t) and the derivative of the analog signal is F'(t). In the example of FIG. 3, F(t) includes a sinewave and F'(t) is the line corresponding to the slope of the analog signal 314 at the zero crossing of the sinewave. The Figure shows how jitter in the sampling clock signal can cause an error ΔV in the sampling of the signal. The sampling error ΔV includes two components; the timing error Δt and the slope of the analog signal F'(t) at the time of the sampling, or ΔV=F'(t)•Δt.

Returning to FIG. 2, the data converter 200 includes a slope calculation circuit 218 and a sampling error circuit 220. The slope calculation circuit 218 generates a digital slope signal representative of slope of the input signal, and the sampling error circuit 220 generates a sampling error signal representative of sampling error by the ADC circuit 212 using the digital slope signal and the sampling clock signal.

Figure 4:
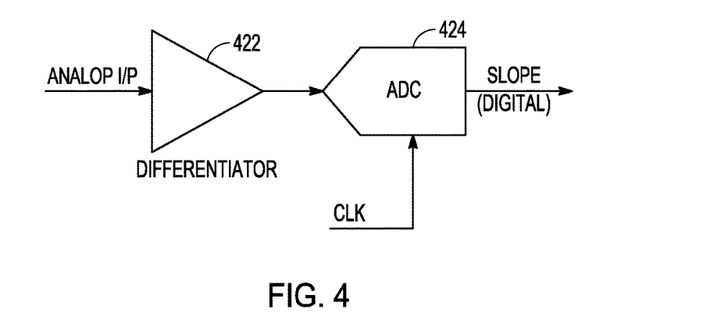
FIG. 4 is a block diagram of an example of a slope calculation circuit.

FIG. 4 is a block diagram of an example of a slope calculation circuit 418 that includes a differentiator circuit 422 and a slope ADC circuit 424. The differentiator circuit 422 generates an analog slope signal F'(t) representative of the slope of the analog signal sampled by the primary ADC circuit 212 of FIG. 2. The slope ADC circuit 424 converts the analog slope signal into the digital slope signal.

Returning to FIG. 2, the sampling error circuit 220 receives the digital slope signal from the slope calculation circuit 218, and receives the output of the digital loop filter and the sampling clock signal from the DPLL circuit 202. The sampling error circuit 220 may generate the sampling error signal ΔV using the digital slope signal, the sampling clock signal, and the output of the digital loop filter. In some embodiments, the output of the TDC circuit of the DPLL circuit can be filtered externally to the DPLL circuit and used to generate the sampling error signal ΔV.

The sampling error circuit 220 can include a timing error calculation circuit 226 and a multiplier circuit 228. The timing error calculation circuit 226 generates a timing error signal Δt representative of error in the sampling clock signal. The sampling error circuit 220 can include a filter circuit to mimic the effect of the change in code on the DCO if the change in code does not instantaneously change the output frequency due to internal parasitic effects in the DCO.

Figure 5:
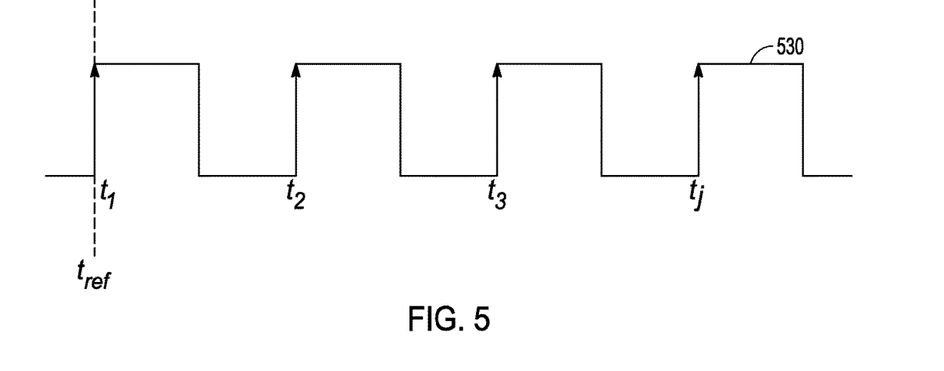
FIG. 5 is an illustration of a sampling clock signal produced by a DPLL circuit.

FIG. 5 is an illustration of the sampling clock signal 530 produced by the DPLL circuit 202. The Figure shows positive clock edges at times $t_1$, $t_2$, $t_3$, and $t_j$. The position of each edge can be calculated using information from the output of the TDC circuit of the DPLL circuit 202. The jitter error (j) of clock edge $t_j$ relative to its ideal position in the signal can be calculated as $(j)=(t_j-t_1)-[(j-1)/f_{avg}]$, where (j−1) is the previous jitter error value and $f_{avg}$ is the average frequency of the sampling clock signal.

Returning to FIG. 2, the timing error calculation circuit 226 may calculate the jitter error and provide the calculated jitter error as the timing error signal Δt. In variations, the timing error calculation circuit 226 may include, or may be included in, a processor to perform the calculations, or the timing error calculation circuit 226 can be included in application specific integrated circuit (ASIC) that performs the calculations. The multiplier circuit 228 multiplies the timing error signal and the digital slope signal to generate the sampling error signal. The data converter 200 includes a summing circuit 232 that receives the sampling error signal ΔV and the digital output signal $V_O$ of the primary ADC circuit and generates an adjusted digital output signal representative of the input signal. In the example of FIG. 2 the sampling error signal is subtracted from the digital output of the primary ADC circuit to generate the adjusted digital output signal.

FIG. 4 is an example of using an analog circuit approach to determine signal slope. The differentiator circuit 422 produces an analog slope signal and the analog slope signal is converted to a digital value of slope using the slope ADC circuit 424. In an example intended to be illustrative and non-limiting, the slope ADC circuit may be a four-bit ADC and the primary ADC circuit may be a twelve-bit ADC. Increasing the number of bits of the slope ADC circuit increases suppression of the jitter error in the sampling clock signal. Analysis has shown that for each additional bit in the slope ADC circuit, six decibels (6 dB) of jitter error suppression is achieved. However, increasing the number of bits in the slope ADC circuit increases the cost of the circuit.

The slope may also be determined using a digital circuit approach. In some examples, the slope calculation circuit 218 of FIG. 2 calculates a value of slope of the input signal as the difference between a first sample of the input signal and a second sample of the input signal divided by a sample clock period, or $$\text{Slope} = \{Din(j) - Din(j-1)\}/T,$$

where Din(j) and Din(j−1) are the two samples or sample points of the input signal and T is the period of the sample clock. In certain variations, the clock period is normalized to one, so no division is needed and the slope can be calculated as the difference between samples. The slope calculation circuit 218 generates the digital slope signal as a running calculation of the value of slope of the input signal. For the digital approach, the slope calculation circuit 218 may be included in a processor or ASIC.

The slope calculation circuit 218 calculates the value of slope of the input signal with a frequency of at least two times a frequency of the input signal. If the value of the slope is calculated at a frequency less than two times the frequency, the slope information may be missed. In some examples, the slope calculation circuit 218 calculates the value of slope of the input signal using three or more sample points of the input signal. While the extra calculation in the three-point approach adds latency to the calculation, it can improve accuracy of the measurement.

Figure 6:
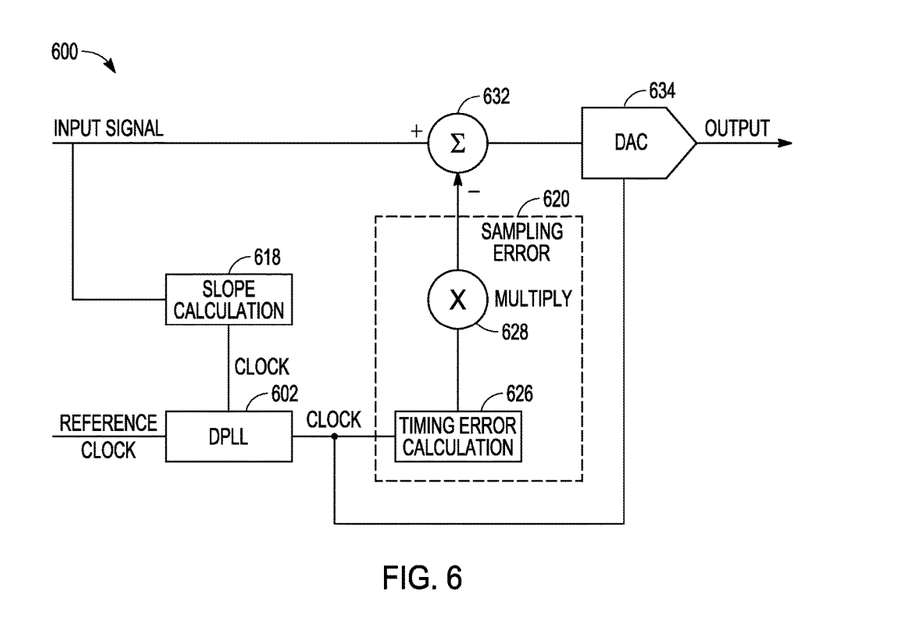
FIG. 6 is a block diagram of an example of a data converter that includes a digital-to-analog converter (DAC) circuit and a DPLL circuit.

FIG. 6 is a block diagram of an example of a data converter 600 that includes a DAC circuit 634 and a DPLL circuit 602. The DAC circuit 634 samples a digital input signal and produces an analog output signal from the sampled input signal. The DPLL circuit 602 provides the sampling clock signal to the DAC circuit 634. The DPLL circuit 602 may have the architecture shown in the example of FIG. 1, and can include a DCO circuit, a TDC circuit, and a loop filter circuit. The data converter 600 includes a slope calculation circuit 618 that calculates the slope of the digital input signal to the DAC circuit 634. The slope calculation circuit 618 may calculate the slope using the digital approach described previously herein, where the slope is the difference between samples of the input signal divided by a sample clock period. The slope calculation circuit 618 may generate a running calculation of the value of slope of the input signal to produce a digital slope signal. In some embodiments, the slope calculation circuit 618 calculates the value of slope of the input signal using three or more sample points of the input signal. In certain embodiments, the slope calculation circuit 618 calculates the value of slope of the input signal at a calculation frequency at least two times a frequency of the input signal.

The data converter 600 also includes a sampling error circuit 620 and a summing circuit 632. The sampling error circuit 620 generates a sampling error signal representative of sampling error by the DAC circuit 634 using the slope of the input signal and the sampling clock signal. The sampling error circuit 620 can include a timing error calculation circuit 626 and a multiplier circuit 628. The timing error calculation circuit is operatively coupled to the DPLL circuit 602 and calculates a timing error representative of error (e.g., jitter error) in the sampling clock signal. The timing error calculation circuit 626 may calculate the timing error using an output of the loop filter circuit of the DPLL. The multiplier circuit 628 multiplies the slope of the input signal and the timing error signal to generate the sampling error signal.

The summing circuit 632 receives the sampling error signal and the input signal, and provides an adjusted input signal as the DAC input signal sampled by the DAC circuit. In this way, the data converter 600 determines the accumulated sampling error and the slope of the input signal, and corrects for the sampling error using pre-processing of the signal provided to the DAC circuit 634.

Figure 7:
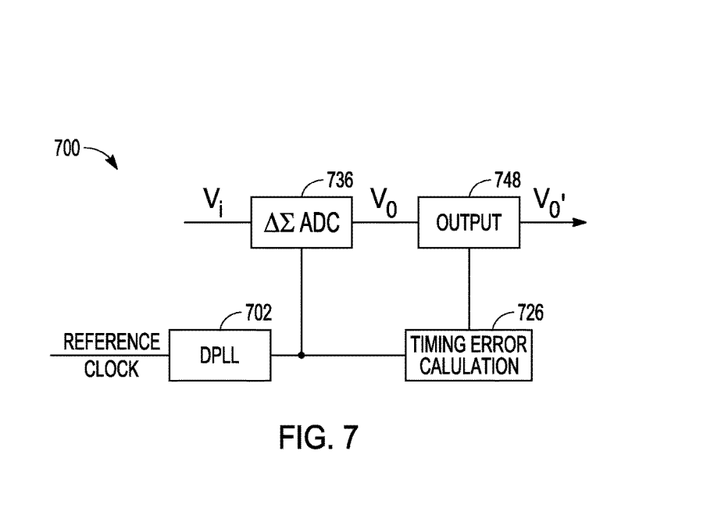
FIG. 7 is a block diagram of an example of a data converter that includes a delta sigma ADC circuit and a DPLL circuit.

FIG. 7 is a block diagram of an example of a data converter 700 that includes a delta sigma analog-to-digital converter (ADC) circuit 736 and a DPLL circuit 702. The delta sigma ADC circuit 736 may be a one bit delta sigma ADC. A one-bit delta sigma ADC converts an input signal (Vi) into a continuous serial stream of ones and zeros at a rate determined by a sampling clock frequency $kf_s$.

Figure 8:
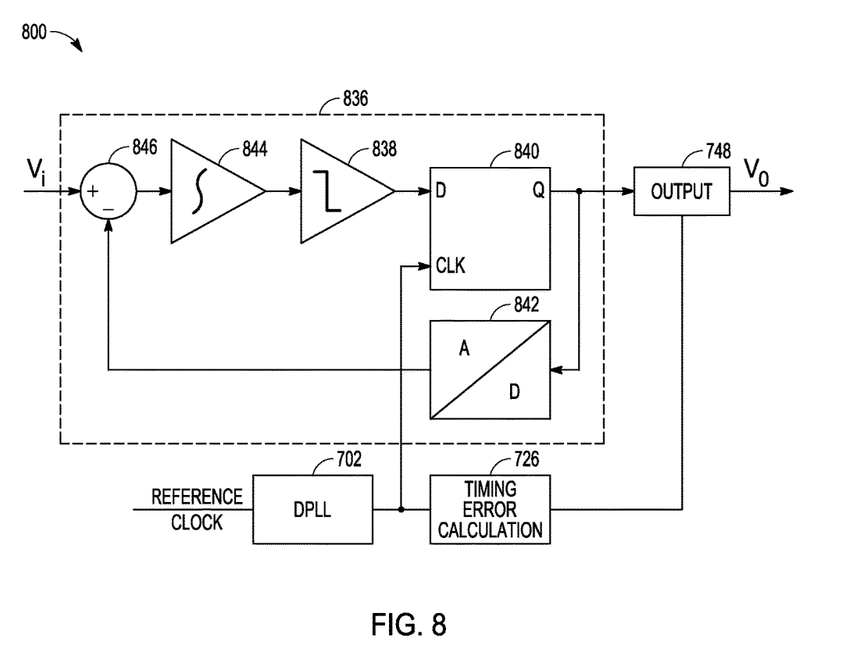
FIG. 8 is a block diagram of another example of a data converter that includes a one-bit continuous time delta sigma ADC circuit and a DPLL circuit.

FIG. 8 is a block diagram of another example of a data converter 800 that includes an example of a one-bit continuous time delta sigma ADC circuit 836. The delta sigma ADC circuit 836 includes a forward circuit path that includes a latched comparator circuit that comprises a comparator circuit 838 and a latch circuit 840. The delta sigma ADC circuit also includes a feedback path coupled to the output of the latched comparator circuit. The feedback path includes a DAC circuit 842. The DAC circuit 842 may be a one-bit DAC circuit, and may be a current feedback DAC. Negative feedback is applied at a circuit summing node 846. In the example of FIG. 8, the forward circuit path includes an integrating circuit 844 operatively coupled to an input of the latched comparator circuit. The integrating circuit 844 may include an operation amplifier (op amp) and the feedback circuit path is coupled to an inverting input of the op amp as the circuit summing node.

For an input signal of zero, the delta sigma ADC circuit output includes an approximately equal number of ones and zeros. For a positive input voltage, the delta sigma ADC output contains more ones than zeros. For a negative input voltage, the delta sigma ADC output contains more zeros than ones. The average value of delta sigma ADC output over a number of cycles represents the input voltage.

Returning to FIG. 7, the data converter 700 includes a DPLL circuit 702 that provides a sampling clock to the delta sigma ADC circuit 736 such as to one or both of the DAC circuit and latch circuit of FIG. 8. The DPLL circuit 702 may have the architecture shown in the example of FIG. 1, and can include a DCO circuit, a TDC circuit, and a loop filter circuit. The data converter also includes a timing error calculation circuit 726 and an output circuit 748. The timing error calculation circuit 726 determines a timing error in the DPLL circuit and generates a correction factor using the determined timing error. The timing error calculation circuit 726 provides the correction factor to the output circuit 748 and the output circuit 748 modifies the output of the delta sigma ADC circuit 736 using the correction factor.

In the example of the delta sigma ADC circuit shown in FIG. 8, the accuracy of the delta sigma converter can be determined by the accuracy of the feedback DAC circuit 842. The timing error will result in the feedback current being too short or too long. The post-processing by the output circuit 748 removes the error due to the DPLL circuit timing from the delta sigma ADC output.

In some embodiments, the timing error calculation circuit 726 determines the frequency error of the DPLL circuit and calculates the correction factor using the determined frequency error. The frequency of the DPLL circuit is determined by the center frequency $f_0$ of the DCO circuit and the gain factor $K_{DCO}$ of the DCO circuit (e.g., in Hertz/Δcode), or $$f_{DPLL} = f_0 = K_{DCO} \cdot v_c,$$

where $v_c$ is the control voltage or DCO code of the DPLL. The correction factor (CF) can be determined as $$CF = (f_0 = K_{DCO} \cdot v_{c(avg)})/(f_0 = K_{DCO} \cdot v_{c(j)}),$$

where $v_{c(j)}$ is the DCO code of the current sample, and $v_{c(avg)}$ is the calculated average value. The output circuit 748 can include a multiplier circuit that multiplies the output of the delta sigma ADC circuit with the correction factor, or $$V_O' = (f_0 - K_{DCO} \cdot v_{c(avg)}) / (f_0 - K_{DCO} \cdot v_{c(j)}) \cdot V_O,$$

where $V_O$ is the output generated by the delta sigma ADC and $V_O'$ is the modified output generated by the output circuit. The timing error in the sampling clock may be caused by error (e.g., jitter error) in the DCO code provided by the TDC of the DPLL. It can be seen in the equations above, that the correction factor will correct for DCO code errors and TDC jitter. To simplify the calculations, the term "$f_0 = K_{DCO} \cdot v_{c(avg)}$" can be replaced by the programmed output frequency of the DPLL if the input clock to the DPLL is known and the divide ratio (1/N) of the feedback divider circuit of the DPLL is known.

The devices and methods described include techniques that can remove or mitigate error in data converters using information that is available at the output of the digital loop filter of the DPLL used in the data converters. This information can indicate whether the DPLL is going to speed up or slow down, and the results of the data converters can be adjusted accordingly.

EXAMPLES AND ADDITIONAL DESCRIPTION

Example 1 includes subject matter (such as an apparatus) comprising a primary analog-to-digital (ADC) circuit configured to sample an input signal and produce a digital output signal representative of the input signal; a slope calculation circuit configured to generate a digital slope signal representative of slope of the input signal; a digital phase lock loop (DPLL) circuit configured to provide a sampling clock signal to the primary ADC circuit; a sampling error circuit configured to generate a sampling error signal representative of sampling error by the primary ADC circuit using the digital slope signal and the sampling clock signal; and a summing circuit configured to receive the sampling error signal and the digital output signal of the primary ADC circuit and generate an adjusted digital output signal representative of the input signal.

In Example 2, the subject matter of Example 1 optionally includes a sampling error circuit including a timing error calculation circuit operatively coupled to the DPLL circuit and configured to generate a timing error signal representative of error in the sampling clock signal; and a multiplier circuit configured to multiply the digital slope signal and the timing error signal to generate the sampling error signal.

In Example 3, the subject matter of Example 2 optionally includes a DPLL circuit that includes a digitally controlled oscillator (DCO) circuit, a time to digital converter circuit (TDC), and a loop filter circuit, and wherein the timing error calculation circuit is configured to calculate a timing error using an output of the loop filter circuit.

In Example 4, the subject matter of one or any combination of Examples 1-3 optionally includes a slope calculation circuit that includes a differentiator circuit configured to generate an analog slope signal representative of slope of the input signal; and a slope ADC circuit configured to convert the analog slope signal into the digital slope signal.

In Example 5, the subject matter of Example 4 optionally includes a sampling error circuit that includes: a timing error calculation circuit operatively coupled to the DPLL circuit and configured to generate a timing error signal representative of jitter error in the sampling clock signal; a multiplier circuit configured to multiply the digital slope signal and the timing error signal to generate the sampling error signal; and wherein the slope ADC circuit includes a number of bits and increasing the number of bits of the slope ADC circuit increases suppression of the jitter error in the sampling clock signal.

In Example 6, the subject matter of one or any combination of Examples 1-5 optionally includes a slope calculation circuit configured to calculate a value of slope of the input signal as a difference between a first sample of the input signal and a second sample of the input signal divided by a sample clock period, and generate the digital slope signal as a running calculation of the value of slope of the input signal.

In Example 7, the subject matter of Example 6 optionally includes a slope calculation circuit configured to calculate the value of slope of the input signal with a frequency of at least two times a frequency of the input signal.

In Example 8, the subject matter of Example 6 optionally includes a slope calculation circuit configured to calculate the value of slope of the input signal using three or more sample points of the input signal.

Example 9 includes subject matter (such as an apparatus), or can optionally be combined with one or any combination of Examples 1-8 to include such subject matter, comprising a slope calculation circuit configured to calculate slope of an input signal; a digital-to-analog converter (DAC) circuit configured to sample a DAC input signal and produce an analog output signal from the sampled DAC input signal; a digital phase lock loop (DPLL) circuit configured to provide a sampling clock signal to the DAC circuit; a sampling error circuit configured to generate a sampling error signal representative of sampling error by the DAC circuit using the slope of the input signal and the sampling clock signal; and a summing circuit configured to receive the sampling error signal and the input signal, and provide an adjusted input signal as the DAC input signal sampled by the DAC circuit.

In Example 10, the subject matter of Example 9 optionally includes a sampling error circuit that includes a timing error calculation circuit operatively coupled to the DPLL circuit and configured to calculate a timing error representative of error in the sampling clock signal; and a multiplier circuit configured to multiply the slope of the input signal and the timing error signal to generate the sampling error signal.

In Example 11, the subject matter of Example 10 optionally includes a DPLL circuit that includes a digitally controlled oscillator (DCO) circuit, a time to digital converter circuit (TDC), and a loop filter circuit. The timing error calculation circuit is optionally configured to calculate the timing error using an output of the loop filter circuit.

In Example 12, the subject matter of one or both of Example 10 and 11 optionally includes a timing error calculation circuit configured to calculate a timing error representative of jitter error in the sampling clock signal.

In Example 13, the subject matter of one or any combination of Examples 9-11 optionally includes a slope calculation circuit configured to calculate a value of slope of the input signal as a difference between a first sample of the input signal and a second sample of the input signal divided by a sample clock period, and generate a running calculation of the value of slope of the input signal as a digital slope signal.

In Example 14, the subject matter of Example 13 optionally includes a slope calculation circuit is configured to calculate the value of slope of the input signal using three or more sample points of the input signal.

In Example 15, the subject matter of one or both of Examples 13 and 14 optionally includes a slope calculation circuit configured to calculate the value of slope of the input signal at a calculation frequency at least two times a frequency of the input signal.

Example 16 can include subject matter (such as an apparatus), or can optionally be combined with one or any combination of Examples 1-15 to include such subject matter, comprising a delta sigma analog-to-digital converter (ADC) circuit, a digital phase lock loop (DPLL) circuit, a timing error calculation circuit, and an output circuit. The delta sigma ADC circuit includes a forward circuit path including a latched comparator circuit; and a feedback path operatively coupled to an output of the latched comparator circuit and including a digital-to-analog converter (DAC) circuit, wherein the DAC circuit is a current DAC circuit. The DPLL circuit is configured to provide a sampling clock signal to the DAC circuit. The timing error calculation circuit is operatively coupled to the DPLL circuit and configured to determine a timing error in the DPLL circuit and generate a correction factor using the timing error. The output circuit is operatively coupled to the delta sigma ADC circuit and the timing error calculation circuit and is configured to modify the output of the delta sigma ADC circuit using the correction factor.

In Example 17, the subject matter of Example 16 optionally includes a timing error calculation circuit configured to determine a frequency error of the DPLL circuit and calculate the correction factor using the determined frequency error, and the output circuit optionally includes a multiplier circuit and is configured to multiply the output of the delta sigma ADC circuit with the correction factor.

In Example 18, the subject matter of one or both of Examples 16 and 17 optionally includes a DPLL circuit that includes a digitally controlled oscillator (DCO) circuit and the output frequency of the DPLL circuit is determined using a DCO code. The timing error calculation circuit is optionally configured to determine the timing error due to a DCO code error and calculate the correction factor using the determined timing error, and the output circuit includes a multiplier circuit and is configured to multiply the output of the delta sigma ADC circuit with the correction factor.

In Example 19, the subject matter of Example 18 optionally includes a DPLL circuit that includes a loop filter circuit and the DCO includes a time to digital converter circuit (TDC).

In Example 20, the subject matter of one or any combination of Examples 16-20 optionally includes a DPLL circuit that includes a digitally controlled oscillator (DCO) circuit, a time to digital converter circuit (TDC), and a loop filter circuit. The timing error calculation circuit is optionally configured to calculate the timing error using an output of the loop filter circuit.

Example 21 can include subject matter, or can optionally be combined with any portion or combination of any portions of any one or more of Examples 1-20 to include such subject matter, comprising means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A digital phase lock loop (DPLL) error correction circuit, the DPLL error correction circuit comprising:
   a primary analog-to-digital converter (ADC) circuit configured to sample an input signal and produce a digital output signal representative of the input signal;
   a digital phase lock loop (DPLL) circuit configured to provide a sampling clock signal to the primary ADC circuit;
   a timing error calculation circuit operatively coupled to the DPLL circuit and configured to determine a timing error representative of error in the sampling clock signal, wherein the timing error calculation circuit includes:
      a slope calculation circuit configured to generate a digital slope signal representative of slope of the input signal; and
      a sampling error circuit configured to determine a sampling error representative of sampling error by the primary ADC circuit using the digital slop signal and the sampling clock signal; and an output circuit operatively coupled to the primary ADC circuit and the timing error calculation circuit and configured to adjust the digital output signal using the determined timing error.

2. The DPLL error correction circuit of claim 1, wherein the DPLL circuit includes a digitally controlled oscillator (DCO) circuit, a time to digital converter circuit (TDC), and a loop filter circuit, and wherein the timing error calculation circuit is configured to calculate the timing error using an output of the loop filter circuit.

3. The DPLL error correction circuit of claim 1,
wherein the sampling error circuit is configured to generate a sampling error signal representative of the sampling error by the primary ADC circuit using the digital slope signal and the sampling clock signal; and
wherein the output circuit includes a summing circuit configured to receive the sampling error signal and the digital output signal of the primary ADC circuit and generate an adjusted digital output signal representative of the input signal.

4. The DPLL error correction circuit of claim 3,
wherein the timing error calculation circuit is configured to generate a timing error signal representative of error in the sampling clock signal; and
wherein the sampling error circuit is configured to multiply the digital slope signal and the timing error signal to generate the sampling error signal.

5. The DPLL error correction circuit of claim 3, wherein the slope calculation circuit includes:
a differentiator circuit configured to generate an analog slope signal representative of slope of the input signal; and
a slope ADC circuit configured to convert the analog slope signal into the digital slope signal.

6. The DPLL error correction circuit of claim 5, including a multiplier circuit;
wherein the timing error calculation circuit is configured to generate a timing error signal representative of jitter error in the sampling clock signal;
wherein the multiplier circuit is configured to multiply the digital slope signal and the timing error signal to generate the sampling error signal; and
wherein the slope ADC circuit includes a number of bits and increasing the number of bits of the slope ADC circuit increases suppression of the jitter error in the sampling clock signal.

7. The DPLL error correction circuit of claim 3, wherein the slope calculation circuit is configured to calculate a value of slope of the input signal as a difference between a first sample of the input signal and a second sample of the input signal divided by a sample clock period, and generate the digital slope signal as a running calculation of the value of slope of the input signal.

8. The DPLL error correction circuit of claim 7, wherein the slope calculation circuit is configured to calculate the value of slope of the input signal with a frequency of at least two times a frequency of the input signal.

9. The DPLL error correction circuit of claim 7, wherein the slope calculation circuit is configured to calculate the value of slope of the input signal using three or more sample points of the input signal.

10. The DPLL error correction circuit of claim 1,
wherein the primary ADC circuit is a delta sigma ADC circuit including:

a forward circuit path including a latched comparator circuit; and
a feedback path operatively coupled to an output of the latched comparator circuit and including a digital-to-analog converter (DAC) circuit, wherein the DAC circuit is a current DAC circuit;
wherein the digital phase lock loop (DPLL) circuit is configured to provide a sampling clock signal to the DAC circuit;
wherein the timing error calculation circuit is configured to determine a timing error in the DPLL circuit and generate a correction factor using the timing error; and
wherein the output circuit is configured to modify the output of the delta sigma ADC circuit using the correction factor.

11. The DPLL error correction circuit of claim 10, wherein the timing error calculation circuit is configured to determine a frequency error of the DPLL circuit and calculate the correction factor using the determined frequency error, and wherein the output circuit includes a multiplier circuit and is configured to multiply the output of the delta sigma ADC circuit with the correction factor.

12. The DPLL error correction circuit of claim 10, wherein the DPLL circuit includes a digitally controlled oscillator (DCO) circuit and an output frequency of the DPLL, circuit is determined using a DCO code, wherein the timing error calculation circuit is configured to determine the timing error due to a DCO code error and calculate the correction factor using the determined timing error, and wherein the output circuit includes a multiplier circuit and is configured to multiply the output of the delta sigma ADC circuit with the correction factor.

13. A digital phase lock loop (DPLL) error correction circuit, the DPLL error correction circuit comprising:
a digital-to-analog converter (DAC) circuit configured to sample a DAC input signal and produce an analog output signal from the sampled DAC input signal;
a digital phase lock loop (DPLL) circuit configured to provide a sampling clock signal to the DAC circuit; and
an error circuit configured to generate a sampling-error signal representative of sampling error by the DAC circuit;
wherein an adjusted input signal is determined using the sampling error signal and provided as the DAC input signal sampled by the DAC circuit.

14. The DPLL error correction circuit of claim 13, including:
a slope calculation circuit configured to calculate slope of an input signal, wherein the error circuit is configured to generate the sampling error signal using the slope of the input signal and the sampling clock signal; and
a summing circuit configured to determine the adjusted input signal using the sampling error signal and the input signal.

15. The DPLL error correction circuit of claim 14, wherein the error circuit includes:
a timing error calculation circuit operatively coupled to the DPLL circuit and configured to calculate a timing error representative of error in the sampling clock signal; and
a multiplier circuit configured to multiply the slope of the input signal and the timing error signal to generate the sampling error signal.

16. The DPLL error correction circuit of claim 15, wherein the DPLL circuit includes a digitally controlled oscillator (DCO) circuit, a time to digital converter circuit (TUC), and a loop filter circuit, and wherein the timing error calculation circuit is configured to calculate the timing error using an output of the loop filter circuit.

17. The DPLL error correction circuit of claim 15, wherein the timing error calculation circuit is configured to calculate a timing error representative of jitter error in the sampling clock signal.

18. The DPLL error correction circuit of claim 14, wherein the slope calculation circuit is configured to calculate a value of slope of the input signal as a difference between a first sample of the input signal and a second sample of the input signal divided by a sample clock period, and generate a running calculation of the value of slope of the input signal as a digital slope signal.

19. The DPLL error correction circuit of claim 18, wherein the slope calculation circuit is configured to calculate the value of slope of the input signal using three or more sample points of the input signal.

20. The DPLL error correction circuit of claim 18, wherein the slope calculation circuit is configured to calculate the value of slope of the input signal at a calculation frequency at least two times a frequency of the input signal.

21. A digital phase lock loop (DPLL) error correction circuit, the DPLL error correction circuit comprising:
   a primary analog-to-digital converter (ADC) circuit configured to sample an input signal and produce a digital output signal representative of the input signal;
   a digital phase lock loop (DPLL) circuit configured to provide a sampling clock signal to the primary ADC circuit;
   a timing error calculation circuit operatively coupled to the DPLL circuit and configured to determine a frequency error in the DPLL circuit and generate a correction factor using the determined frequency error; and
   wherein the output circuit is configured to modify the digital output signal using the correction factor.

22. The DPLL error correction circuit claim 21, wherein the ADC circuit is a delta sigma ADC circuit and the output circuit includes a multiplier circuit configured to multiply the output of the delta sigma ADC circuit with the correction factor.

23. The DPLL error correction circuit of claim 21, wherein the DPLL:
   circuit includes a digitally controlled oscillator (DCO) circuit and an output frequency of the DPLL circuit is determined using a DCO code, wherein the timing error calculation circuit is configured to determine the timing error due to a DCO code error and calculate the correction factor using the determined timing error, and wherein the output circuit includes a multiplier circuit and is configured to multiply the output of the ADC circuit with the correction factor.

24. The DPLL error correction circuit of claim 21, wherein the DPLL, circuit includes a digitally controlled oscillator (DCO) circuit, a time to digital converter circuit (TDC), and a loop filter circuit, and wherein the timing error calculation circuit is configured to calculate the timing error using an output of the loop filter circuit.

* * * * *

UNITED STATES PATENT AND TRADEMARK OFFICE
CERTIFICATE OF CORRECTION

PATENT NO. : 10,367,516 B2
APPLICATION NO. : 15/674985
DATED : July 30, 2019
INVENTOR(S) : Thompson et al.

It is certified that error appears in the above-identified patent and that said Letters Patent is hereby corrected as shown below:

In the Claims

Column 11, Line 1, Claim 1, delete "slop" and insert --slope-- therefor

Column 12, Line 26, Claim 12, delete "DPLL," and insert --DPLL-- therefor

Column 12, Line 40, Claim 13, delete "sampling-error" and insert --sampling error-- therefor Column 12, Line 67, Claim 16, delete "(TUC)," and insert --(TDC),-- therefor

Column 14, Line 8, Claim 22, after "circuit", insert --of--

Column 14, Line 14, Claim 23, delete "DPLL:" and insert --DPLL-- therefor

Column 14, Line 15, Claim 23, before "circuit", delete "¶"

Column 14, Line 25, Claim 24, delete "DPLL," and insert --DPLL-- therefor

Signed and Sealed this
Twenty-eighth Day of April, 2020

Andrei Iancu
*Director of the United States Patent and Trademark Office*